US 6,657,390 B2

(12) United States Patent
Serizawa et al.

(10) Patent No.: US 6,657,390 B2
(45) Date of Patent: Dec. 2, 2003

(54) SHORT-ARC DISCHARGE LAMP

(75) Inventors: Izumi Serizawa, Chino (JP); Masaaki Miyazawa, Chino (JP); Akiyoshi Fujimori, Tokyo (JP)

(73) Assignee: ORC Manufacturing Co., Ltd., Tokyo (JP)

(*) Notice: Subject to any disclaimer, the term of this patent is extended or adjusted under 35 U.S.C. 154(b) by 22 days.

(21) Appl. No.: 09/975,742

(22) Filed: Oct. 10, 2001

(65) Prior Publication Data
US 2002/0163307 A1 Nov. 7, 2002

(30) Foreign Application Priority Data
Feb. 23, 2001 (JP) .......................... 2001-048286

(51) Int. Cl.[7] .................... H01J 17/20; H01J 61/20
(52) U.S. Cl. .................. 313/642; 313/631; 313/637; 313/639; 313/643
(58) Field of Search ........................... 313/642, 568, 313/570, 571, 631, 632, 637, 638, 639, 643

(56) References Cited

U.S. PATENT DOCUMENTS

| | | | | |
|---|---|---|---|---|
| 3,895,251 A | * | 7/1975 | Gungle et al. | 313/642 |
| 5,523,655 A | * | 6/1996 | Jennato et al. | 315/246 |
| 6,046,544 A | * | 4/2000 | Daemen et al. | 313/633 |

* cited by examiner

*Primary Examiner*—Nimeshkumar D. Patel
*Assistant Examiner*—Elizabeth Gemmell
(74) *Attorney, Agent, or Firm*—Dellett and Walters

(57) ABSTRACT

To realize high irradiation efficiency and intensity stability for extending lifetime of the short-arc discharge lamp to be used for IC exposure apparatus or the like. For this end, mercury and rare gases are sealed in the inner space 21 of the discharge tube 1. The rare gases are a mixture of a relatively high molecular weight rare gas such as xenon, krypton, argon, etc. and 5%–40% by volume of a relatively low molecular weight rare gas such as helium, neon, etc. And pressure of the mixed rare gases is set to 2 atmospheric pressure or higher. The anode 3 comprises the columnar body portion 14, the tapered portion 13 and the flat portion 12.

15 Claims, 1 Drawing Sheet

SHORT-ARC DISCHARGE LAMP

BACKGROUND OF THE INVENTION

The present invention relates to a discharge lamp, more specifically to a highly stable, long lifetime short-arc discharge lamp to be utilized for light exposure apparatus for fabrication of semiconductor integrated circuits (ICs)

IC fabrication processes require various technologies including a light exposure technology (or photolithography). A special resin to be hardened by exposure of ultra violet ray is used to form a desired pattern on a semiconductor substrate. The exposure apparatus to be used for fabrication of such electronic devices is generally short-arc discharge lamps. In particular, as the recent ICs are highly integrated, discharge lamps for efficiently irradiating approximately 365 nm short wavelength i-ray are mostly used for such applications.

Since IC technologies advance very rapidly, IC fabrication requires a large capital investment and encounters severe cost competition. It is therefore essential for the success of IC manufacturers to reduce production cost. Also, there are strong needs for reducing the running cost by extending the lifetime of a short-arc discharge lamp that is one of key consumption equipment. Conventional ways of extending lifetime of a short-arc discharge lamp include suppressing the reduction in intensity by improving shapes and treatments of various constituent elements or materials of the electrodes, or improving i-ray irradiation efficiency to increase the intensity on the exposure surface.

A short-arc discharge lamp utilizing i-ray for an IC exposure apparatus typically uses approximately ½~1/10 mercury content to be sealed in the lamp as compared with a short-arc discharge lamp to be normally used in an exposure apparatus for liquid crystal display panels (LCDs) and printed circuit boards (PCBs) in order to enhance the i-ray irradiation efficiency. This tends to decrease the internal pressure in the discharge tube. A common approach to overcome the decreased irradiation intensity due to decreased internal pressure is to increase rare gas pressure sealed in the discharge lamp as a buffer. This is effective to suppress wear of the electrode and also decrease the intensity maintenance rate.

In the exposure apparatus, the radiated i-ray is not only used for the exposure purpose but also for focus control in exposure, thereby requiring highly stable intensity. In more recent years, shorter wavelength light sources such as excimer lasers are used. This makes it effective to expose light while scanning on a substrate, thereby increasing the needs for high intensity stability.

SUMMARY OF THE INVENTION

It was impossible to sufficiently meet the needs for extend lifetime of the light source for exposure apparatus. It is therefore an object of the present invention to provide a short-arc discharge lamp having extended lifetime, high intensity efficiency and stabilized intensity.

In order to overcome the above problem and to achieve the above object, the short-arc discharge lamp according to the present invention comprises a discharge tube having a cathode and an anode disposed within the tube in an opposed relationship and mercury and rare gasses sealed inside the tube. It features in the sealed rare gases comprising a mixture of a high molecular weight rare gas such as xenon (Xe), krypton (Kr) or argon (Ar) and 5%~40% by volume of a low molecular weight rare gas such as helium (He) or neon (Ne). And the pressure of the mixed rare gases is set to 2 atmospheric pressure or higher at normal temperature.

The anode comprises a substantially columnar body portion, a tapered portion and a flat end portion. The distance L (mm) of the point having the current density of 0.3A per square mm from the flat portion is set to $0.051 < L < 0.081$, where I (A) is the discharge current. The diameter of the flat portion at the front end of the anode is set to 2 times or less the distance between the cathode and the anode. And the current density of the anode is set to 3.5A or less per square mm.

DESCRIPTION OF THE DRAWINGS

An embodiment of the present invention will be described in detail by reference to the accompanying drawings. In the drawings.

DESCRIPTION OF PREFERRED EMBODIMENT

Figure 1:
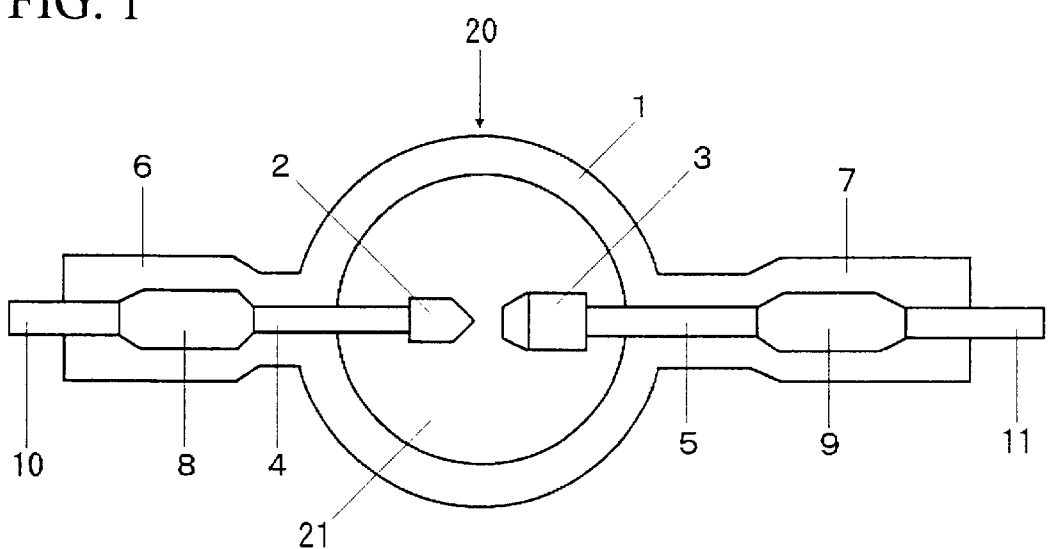
FIG. 1 is a cross section view of one embodiment of the short-arc discharge lamp according to the present invention.

Firstly, the short-arc discharge lamp 20 as illustrated in cross section view in FIG. 1 comprises a discharge tube 1, a cathode 2, an anode 2, internal lead rods 4,5 for the electrodes 2,3, sealing portions 6,7 of the discharge tube 1, external lead rods 10,11 and metal foil portions 8,9 for respectively interconnecting the internal lead rods 4,5 and the external lead rods 10, 11. And mercury and rare gases are sealed within the inner space 21 in the discharge tube 1.

Figure 2:
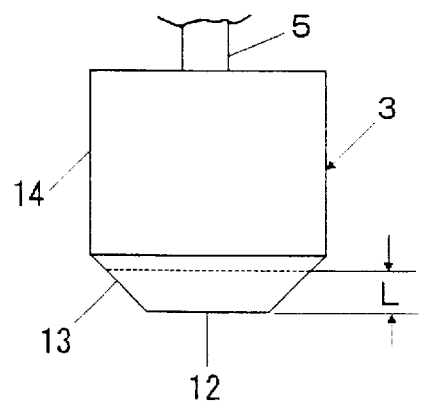
FIG. 2 is an enlarged anode to be used in the short-arc discharge lamp as illustrated in FIG. 1.

The anode 3 as illustrated in FIG. 2 can be used for the short-arc discharge lamp 20 as illustrated in FIG. 1. As apparent from FIG. 2, the anode 3 comprises a flat portion 12 at the front end as opposed to the cathode 2, a chamfered conical portion, or a tapered portion 13 and a substantially columnar body portion 14.

Now, detailed dimensions of the short-arc discharge lamp 20 according to the present invention will be described by reference to FIGS. 1 and 2. The discharge tube 1 is made from a light transparent glass such as quartz glass and has the outer diameter of, e.g., 70 mm. The cathode 2 is made from, e.g., tungsten including approximately 2% by weight of thoria and has the diameter of approximately 10 mm. The end of the cathode 2 opposed to the anode 3 is sharpened and is distant from approximately 4.5 mm from the flat portion 12 at the front end of the anode 3. On the other hand, the anode 3 comprises the flat portion 12 having the diameter of approximately 7 mm and the current density of approximately 0.3A per square mm and a body portion 14 having the diameter of approximately 25 mm. The distance L (mm) of the point having the current density of 0.3A per square mm from the flat portion 12 is approximately 3.5 mm. Sealed in the inner space 21 of the discharge tube 1 is approximately 4.5 mg/cc mercury.

Now, described are preliminary experiment results to confirm the improved intensity of the high pressure rare gas sealed in the inner space 21 of the discharge tube 1. Sealed in the inner space 21 are 4.5 mg/cc mercury and a relatively high molecular weight rare gas such as xenon (Xe), krypton (Kr) or argon (Ar). Total 18 discharge lamps having different sealing pressures at normal temperature are manufactured. Intensity and intensity stability on the surface of the IC exposure apparatus are compared. All of the discharge lamps are operated by 2500 W. The discharge current was 100A.

The Table 1 below shows the experiment results.

TABLE 1

| Sealing Pressure | Sealed rare gas Xe | | Sealed rare gas Kr | | Sealed rare gas Ar | |
|---|---|---|---|---|---|---|
| (atm.) | intensity | Stability | intensity | Stability | intensity | Stability |
| 1.0 | 1.00 | 1.10 | 1.00 | 1.06 | 1.00 | 0.95 |
| 2.0 | 1.02 | 1.29 | 1.03 | 1.18 | 1.05 | 0.98 |
| 4.0 | 1.03 | 1.56 | 1.06 | 1.26 | 1.10 | 1.04 |
| 7.0 | 1.06 | 1.70 | 1.06 | 1.38 | 1.12 | 1.13 |
| 10.0 | 1.07 | 1.95 | 1.10 | 1.51 | 1.14 | 1.22 |
| 13.0 | 1.08 | 2.21 | 1.11 | 1.64 | 1.15 | 1.31 |

As apparent from Table 1, experiments were made at sealing pressures of 1.0, 2.0, 4.0, 7.0, 10.0 and 13.0 atmospheric pressure for the samples with sealed rare gases of Xe, Kr and Ar. Intensity was measured 5 times for each sealing pressure to obtain the average of the measurements as the intensity of the discharge lamp. Intensity difference of the 5 measurements was 0.02 and the sealing rare gas pressure to exhibit at least 0.02 or higher intensity improvement was 2.0 atmospheric pressure or higher. The intensity stability is determined by the difference between the maximum and the minimum values of 25 seconds continuous measurements divided by the average intensity. Such measurements were made 5 times to obtain the average. It is recognized that the intensity stability decreases as the sealing pressure increases.

Now, experiments on mixed rare gases sealed in the inner space 21 of the discharge tube 1 of the short-arc discharge lamp according to the present invention will be described. Total 28 discharge lamps sealing 4.5 mg/cc mercury and 2 and 7 atmospheric pressures of Xe, Kr and Ar rare gases and 5%~40% by volume of relatively low molecular weight neon (Ne) and helium (He) gases. Intensity and intensity stability on the surface of the IC exposure apparatus were compared to obtain the experimental results as shown in Table 2. The intensity stability is the average of 5 measurements. Since there is about 0.2 difference, any superiority in intensity stability should be lower than the value. In the samples, superiority is recognized in all discharge lamps having Ne or He. Also, no intensity reduction is recognized.

When the sealing pressure of the mixed gases at 2 atmospheric pressure or higher at normal temperature, it was difficult to seal Ne or He at or higher than 40% by volume with respect to other rare gases. Accordingly, in order to improve intensity and intensity stability by mixing a plurality of rare gases, it was recognized that the effective sealing pressure of a plurality of rare gases at normal temperature is 2 atmospheric pressure or higher and Ne or He is 5%~40% by volume of Xe, Kr or Ar. The reason is because heat conductivity of relatively low molecular weight Ne or He is higher than that of the rare gas such as Xe, Kr or Ar to be mixed. It is apparent that similar advantage will result by mixing both rare gases of Ne and He. Also, the rare gases to be mixed may be a mixture of the rare gasses of Xe, Kr and Ar.

Now, a description will be made on the lifetime of discharge lamp with respect to the current density of the anode 3. The current density is equal to the discharge current divided by the cross section area of the anode 3. The lifetime is compared by the intensity maintenance rate over 1500 hours continuous irradiation with the initial intensity setting to 100%. Note that the anode 3 is configured to have the flat portion 12 towards the columnar body portion 14 as illustrated in FIG. 2. Experiments were made by varying the distance L (mm) from 3 mm~10 mm in 1 mm step.

8 kinds of discharge lamps are manufactured by sealing 4.5 mg/cc mercury and mixed rare gasses of Ar including 10% by volume of Ne at 7 atmospheric pressure at normal temperature. The distance L (mm) from the flat portion 12 towards the columnar body portion 14 of the anode 3 is varied as a parameter to make the 8 discharge lamps. Experiments are made to measure the intensity and intensity maintenance rate. Other specifications of the discharge lamps are the same as the above. The experiment results are shown in the following Table 3.

TABLE 2

| Total gas Pressure | Ne or He ratio | Sealed rare gas Xe | | Sealed rare gas Kr | | Sealed rare gas Ar | |
|---|---|---|---|---|---|---|---|
| (atm.) | by volume | intensity | Stability | intensity | Stability | intensity | Stability |
| 2.0 | Ne 40% | 1.04 | 0.68 | 1.05 | 0.66 | 1.08 | 0.67 |
| 2.0 | Ne 20% | 1.04 | 0.82 | 1.04 | 0.76 | 1.07 | 0.74 |
| 2.0 | Ne 10% | 1.04 | 0.97 | 1.03 | 0.96 | 1.06 | 0.76 |
| 2.0 | Ne 5% | 1.03 | 1.09 | 1.03 | 0.97 | 1.06 | 0.77 |
| 2.0 | none | 1.02 | 1.29 | 1.03 | 1.05 | 1.05 | 0.98 |
| 7.0 | Ne 10% | 1.07 | 1.36 | 1.07 | 1.14 | 1.12 | 0.79 |
| 7.0 | Ne 5% | 1.06 | 1.43 | 1.07 | 1.15 | 1.12 | 0.86 |
| 7.0 | none | 1.06 | 1.70 | 1.06 | 1.38 | 1.12 | 1.13 |
| 2.0 | He 40% | 1.05 | 0.66 | — | — | — | — |
| 2.0 | He 5% | 1.03 | 1.08 | — | — | — | — |
| 7.0 | He 10% | 1.07 | 1.34 | — | — | — | — |
| 7.0 | He 5% | 1.07 | 1.44 | — | — | — | — |

TABLE 3

| Sealed Rare gas | Volume % of No | Total gas pressure (atm.) | end of anode D (mm) | I dens. (A/mm²) | L I dens. | L (mm) | Inten. | Inten. maint. rate |
|---|---|---|---|---|---|---|---|---|
| Ar | 10% | 7 | 7 | 2.6 | 0.031 | 3 | 0.76 | 89% |
| Ar | 10% | 7 | 7 | 2.6 | 0.041 | 4 | 0.83 | 86% |
| Ar | 10% | 7 | 7 | 2.6 | 0.051 | 5 | 1.00 | 87% |
| Ar | 10% | 7 | 7 | 2.6 | 0.061 | 6 | 1.01 | 86% |
| Ar | 10% | 7 | 7 | 2.6 | 0.071 | 7 | 1.01 | 84% |
| Ar | 10% | 7 | 7 | 2.6 | 0.081 | 8 | 1.01 | 85% |
| Ar | 10% | 7 | 7 | 2.6 | 0.091 | 9 | 1.00 | 79% |
| Ar | 10% | 7 | 7 | 2.6 | 0.101 | 10 | 1.00 | 72% |

Notes:
Unit of the total gas pressure is atmospheric pressure.
D means diameter.
I dens. means current density.
Inten. means intensity.
Inten. maint. rate means intensity maintenance rate.

Intensity decrease is observed when the distance L from the flat portion 12 of the anode 3 towards the body portion 14 is 4 mm or less. It is assumed that the anode 3 itself shields the irradiation, thereby decreasing the intensity. On the other hand, decrease in the intensity maintenance rate is observed when the distance L from the flat portion 12 of the anode 3 towards the columnar body portion 14 is 9 mm or larger. It is assumed that the high current density at the flat portion 12 of the anode 3 increases the anode temperature at the end portion and accelerates wear of the anode 3 by bombardment of discharging electrons and ions. Observation of the discharge lamps after the intensity maintenance rate experiments proved a deep crater-like hole formed at the top of each anode.

Similarly, 16 kinds of discharge lamps are manufactured to make intensity and intensity maintenance rate experiments. Sealed are 4.5 mg/cc mercury and mixed rare gases of Ar and 10% by volume of Ne at 7 atmospheric pressure at normal temperature. The distance L (mm) of the point having the current density of 0.3A per square mm from the flat portion 12 towards the columnar body portion 14 of the anode 3 is set to 3 mm and 5 mm with varying diameters of the flat portion 12 of the anode 3 as a parameter. Other specifications of the discharge lamps are the same as the above. Experimental results are shown in the following Table 4.

TABLE 4

| Sealed Rare gas | Volume % of Ne | Total gas pressure (atm.) | end of anode D (mm) | I dens. (A/mm²) | L I dens. | L (mm) | Inten. | Inten. maint. rate |
|---|---|---|---|---|---|---|---|---|
| Ar | 10% | 7 | 5.0 | 5.1 | 0.051 | 5 | 1.00 | 68% |
| Ar | 10% | 7 | 5.5 | 4.2 | 0.051 | 5 | 1.00 | 76% |
| Ar | 10% | 7 | 6.0 | 3.5 | 0.051 | 5 | 1.01 | 84% |
| Ar | 10% | 7 | 6.5 | 3.0 | 0.051 | 5 | 1.00 | 86% |
| Ar | 10% | 7 | 7.0 | 2.6 | 0.051 | 5 | 1.00 | 87% |
| Ar | 10% | 7 | 8.0 | 2.0 | 0.051 | 5 | 0.98 | 88% |
| Ar | 10% | 7 | 9.0 | 1.6 | 0.051 | 5 | 0.98 | 92% |
| Ar | 10% | 7 | 10.0 | 1.3 | 0.051 | 5 | 0.75 | 90% |
| Ar | 10% | 7 | 5.0 | 5.1 | 0.081 | 8 | 1.02 | 63% |
| Ar | 10% | 7 | 5.5 | 4.2 | 0.081 | 8 | 1.01 | 72% |
| Ar | 10% | 7 | 6.0 | 3.5 | 0.081 | 8 | 1.00 | 81% |
| Ar | 10% | 7 | 6.5 | 3.0 | 0.081 | 8 | 1.01 | 82% |
| Ar | 10% | 7 | 7.0 | 2.6 | 0.081 | 8 | 1.01 | 85% |
| Ar | 10% | 7 | 8.0 | 2.0 | 0.081 | 8 | 0.98 | 83% |
| Ar | 10% | 7 | 9.0 | 1.6 | 0.081 | 8 | 0.99 | 85% |
| Ar | 10% | 7 | 10.0 | 1.3 | 0.081 | 8 | 0.76 | 87% |

Apparent decrease in intensity is observed when the diameter of the flat portion 12 of the anode 3 is 10 mm or larger regardless of 3 mm or 5 mm distance L of the portion having the current density of 0.3A per square mm from the flat portion 12 of the anode 3. Similar to the above, it is assumed the anode 3 itself shields the irradiation to decrease intensity. In the discharge lamp, since the distance (or gap) between the cathode 2 and the anode 3 is 4.5 mm, no such problem is observed when the diameter is 2 times of the distance or larger. Intensity maintenance rate is observed when the diameter of the flat portion 12 of the anode 3 is 5.5 mm or less. Similar to the above, it is assumed that the temperature of the flat portion 12 of the anode 3 is high, thereby accelerating wear of the anode 3 by bombardment of discharging electrons and ions. Observation of the sample discharge lamps after conducting intensity maintenance rate experiments proves a deep crater-like hole at the top of the anode 3.

As a conclusion of the experiments on these discharge lamps, in order to extend lifetime of the discharge lamp, it is effective to set the distance L (mm) of the point having the current density of 0.3A per square mm from the flat portion 12 towards the columnar body portion 14 in the range between 0.05I and 0.08I, where I is the discharge current. Also, the flat portion 12 of the anode 3 should have the area to have 3.5A per square mm or less and the diameter equal to 2 times or less the gap between the cathode 2 and the anode 3.

A preferred embodiment of the short-arc discharge lamp according to the present invention has been described in detail. However, the present invention should not be restricted to only such embodiment. A person having an ordinary skill in the art will easily understand that various modifications can be made without departing from the scope and spirit of the present invention.

ADVANTAGES OF THE INVENTION

As understood from the above description, the short-arc discharge lamp according to the present invention has rare gases and mercury sealed in the discharge tube and the rare gases are a mixture of a relatively high molecular weight rare gas such as Xe, Kr or Ar and 5%–40% by volume of a relatively low molecular weight rare gas such as Ne or He. Pressure of the mixed rare gases is set to 2 atmospheric pressure or higher. Accordingly, intensity and intensity maintenance rate are improved.

Also, the distance L (mm) of the point having the current density of 0.3A per square mm from the flat portion 12 towards the columnar body portion 14 of the anode 3 is set to the following range:

$$0.05I<L<0.08I$$

where, I is the discharge current.
The flat portion 12 of the anode has the diameter equal to 2 times or less the gap between the cathode and the anode and has an area to set 3.5A per square mm or higher current density, thereby providing a short-arc discharge lamp with extended lifetime, high irradiation efficiency and high intensity stability.

What is claimed is:

1. A short-arc discharge lamp including a cathode and an anode in an opposed relationship within a discharge tube and also having mercury and rare gases sealed in the space of the discharge tube, characterized in that the rare gases are a mixture of a high molecular weight rare gas and a low molecular weight rare gas of approximately 5%–40% by volume with respect to the high molecular weight rare gas, and that the pressure of the mixed gases is set to 2 atmospheric pressure or higher at normal temperature.

2. A short-arc discharge lamp of claim 1, wherein xenon, krypton, argon or the mixture thereof is used as the high molecular weight gas.

3. A short-arc discharge lamp of claim 2, wherein helium, neon or a mixture thereof is used as the low molecular weight rare gas.

4. A short-arc discharge lamp of claim 1, wherein helium, neon or a mixture thereof is used as the low molecular weight rare gas.

5. A short-arc discharge lamp of claim 1, wherein the anode comprises a substantially columnar body portion, a tapered portion at the cathode side of the body portion and a flat portion at the front end of the tapered portion.

6. A short-arc discharge lamp of claim 5, wherein the area of the flat portion at the end of the anode is set to have the current density of 3.5A per square mm or less.

7. A short-arc discharge lamp including a cathode and an anode in an opposed relationship within a discharge tube and also having mercury and rare gases sealed in the space of the discharge tube, characterized in that the rare gases are a mixture of a high molecular weight rare gas and a low molecular weight rare gas of approximately 5%–40% by volume with respect to t e high molecular weight rare gas, and that the pressure of the mixed gases is set to 2 atmospheric pressure or higher at normal temperature, wherein the distance L(mm) of the point having the current density of 0.3A per square mm from the end of the anode is set to 0.05I<L<0.08I, where I represents the discharge current.

8. A short-arc discharge lamp of claim 7, wherein the diameter of the flat portion at the front end of the anode is set to 2 times or less the distance between the cathode and the anode.

9. A short-arc discharge lamp of claim 8, wherein the area of the flat portion at the end of the anode is set to have current density of 3.5A per square mm or less.

10. A short-arc discharge lamp of claim 7, wherein the area of the flat portion at the end of the anode is set to have the current density of 3.5A per square mm or less.

11. A short-arc discharge lamp of claim 7, wherein xenon, krypton, argon or the mixture thereof is used as the high molecular weight gas.

12. A short-arc discharge lamp of claim 11, wherein helium, neon or a mixture thereof is used as the low molecular weight rare gas.

13. A short-arc discharge lamp of claim 5, wherein helium, neon or a mixture thereof is used as the low molecular weight rare gas.

14. A short-arc discharge lamp of claim 7, wherein the anode comprises a substantially columnar body portion, a tapered portion at the cathode side of the body portion and a flat portion at the front end of the tapered portion.

15. A short-arc discharge lamp of claim 14, wherein the area of the flat portion at the end of the anode is set to have the current density of 3.5A per square mm or less.

* * * * *